US011737208B2

(12) United States Patent
Marin et al.

(10) Patent No.: US 11,737,208 B2
(45) Date of Patent: Aug. 22, 2023

(54) MICROELECTRONIC ASSEMBLIES HAVING CONDUCTIVE STRUCTURES WITH DIFFERENT THICKNESSES

(71) Applicant: Intel Corporation, Santa Clara, CA (US)

(72) Inventors: Brandon C. Marin, Chandler, AZ (US); Andrew James Brown, Phoenix, AZ (US); Rahul Jain, Gilbert, AZ (US); Dilan Seneviratne, Phoenix, AZ (US); Praneeth Kumar Akkinepally, Tempe, AZ (US); Frank Truong, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 984 days.

(21) Appl. No.: 16/268,813

(22) Filed: Feb. 6, 2019

(65) Prior Publication Data

US 2020/0253037 A1    Aug. 6, 2020

(51) Int. Cl.
*H05K 1/02* (2006.01)
*H05K 1/11* (2006.01)
*H05K 1/18* (2006.01)
*H01L 23/498* (2006.01)

(52) U.S. Cl.
CPC ..... *H05K 1/0228* (2013.01); *H01L 23/49822* (2013.01); *H05K 1/0298* (2013.01); *H05K 1/111* (2013.01); *H05K 1/115* (2013.01); *H05K 1/181* (2013.01)

(58) Field of Classification Search
CPC .... H05K 1/0228; H05K 1/0298; H05K 1/115; H05K 3/0032; H05K 3/0035; H05K 3/105; H05K 3/107; H05K 3/4644; H05K 2201/0376; H01L 23/49822; H01L 2224/16225; H01L 2924/15311; H01L 23/145; H01L 23/49816; H01L 21/4857
See application file for complete search history.

(56) References Cited

U.S. PATENT DOCUMENTS

| 4,080,513 A * | 3/1978 | Cuneo | H05K 3/107 174/255 |
| 4,804,615 A * | 2/1989 | Larson | H05K 3/427 430/314 |
| 5,266,446 A * | 11/1993 | Chang | H01L 21/481 438/692 |

(Continued)

FOREIGN PATENT DOCUMENTS

| JP | WO 2012132325 | * | 4/2012 |
| WO | 2016133489 A1 | | 8/2016 |

(Continued)

*Primary Examiner* — Ishwarbhai B Patel
(74) *Attorney, Agent, or Firm* — Akona IP

(57) ABSTRACT

Microelectronic assemblies, and related devices and methods, are disclosed herein. For example, in some embodiments, a microelectronic assembly may include a substrate layer having a surface, wherein the substrate layer includes a photo-imageable dielectric (PID) and an electroless catalyst; a first conductive trace having a first thickness on the surface of the substrate layer; and a second conductive trace having a second thickness on the surface of the substrate layer, wherein the first thickness is greater than the second thickness.

13 Claims, 6 Drawing Sheets

(56) References Cited

U.S. PATENT DOCUMENTS

| | | | |
|---|---|---|---|
| 7,834,277 B2* | 11/2010 | Ohsumi | H05K 3/427 |
| | | | 174/266 |
| 2011/0048783 A1* | 3/2011 | Yu | H05K 3/465 |
| | | | 29/846 |
| 2011/0308848 A1* | 12/2011 | Ito | H05K 3/045 |
| | | | 29/829 |
| 2014/0160707 A1 | 6/2014 | Zhang et al. | |
| 2015/0279731 A1* | 10/2015 | Li | H01L 21/486 |
| | | | 438/654 |
| 2016/0104632 A1 | 4/2016 | Zhang et al. | |
| 2016/0157344 A1* | 6/2016 | Wang | H05K 3/182 |
| | | | 174/257 |
| 2016/0374210 A1* | 12/2016 | Marin | H01L 23/528 |
| 2017/0053840 A1 | 2/2017 | Basker et al. | |

FOREIGN PATENT DOCUMENTS

| | | | |
|---|---|---|---|
| WO | 2016144320 A1 | 9/2016 | |
| WO | 2017171824 A1 | 10/2017 | |

* cited by examiner

MICROELECTRONIC ASSEMBLIES HAVING CONDUCTIVE STRUCTURES WITH DIFFERENT THICKNESSES

BACKGROUND

Integrated circuit devices are conventionally coupled to a package substrate for mechanical stability and to facilitate connection to other components via conductive pathways in the package substrate, such as circuit boards. The conductive pathways may include signal traces for the routing of signals.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1A:
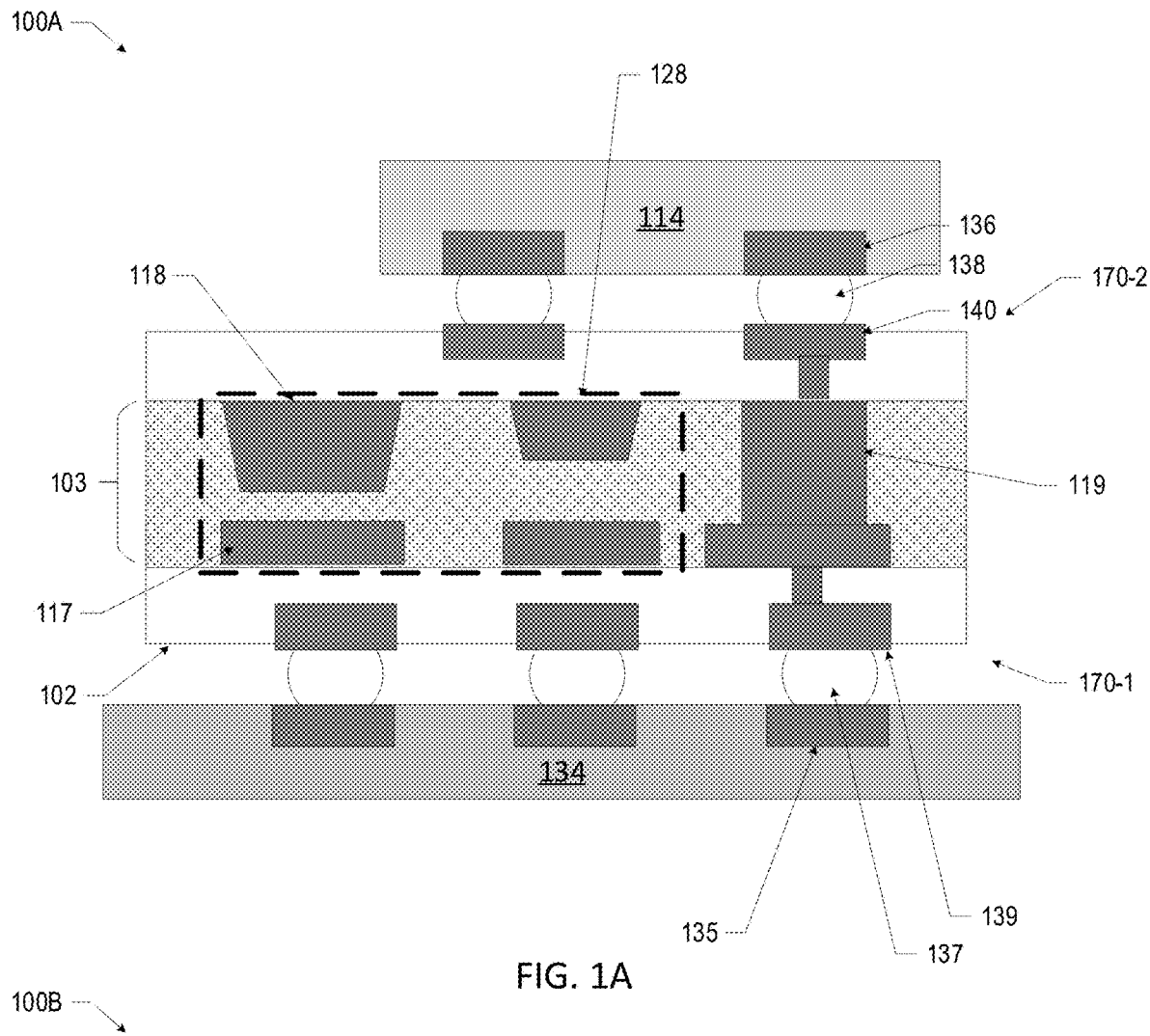
FIG. 1A is a side, cross-sectional view of an example microelectronic assembly, in accordance with various embodiments.

Microelectronic assemblies that include a substrate having two or more conductive traces with different thicknesses thereon and related devices and methods are disclosed herein. For example, in some embodiments, a microelectronic assembly may include a substrate having a surface, wherein the substrate includes an electroless catalyst and a photo-imageable dielectric; a first conductive trace having a first thickness on the surface of the substrate; and a second conductive trace having a second thickness on the surface of the substrate, wherein the second thickness is different from the first thickness. In some embodiments, a method of manufacturing a microelectronic assembly may include depositing an electroless catalyst-doped photo-imageable dielectric (PID) on a substrate; laser drilling the electroless catalyst-doped PID to form a first opening having a first thickness and a second opening having a second thickness, wherein the first thickness is greater than the second thickness; and depositing a conductive material in the first opening to form a first conductive trace having the first thickness and in the second opening to form a second conductive trace having the second thickness.

Communicating large numbers of signals in an integrated circuit (IC) package is challenging due to the increasingly small size of IC dies, thermal constraints, z-height constraints, form factor constraints, performance constraints, and power delivery constraints, among others. In some embodiments, it may be desirable for traces to have different cross-sectional areas and/or different thicknesses (e.g., a first trace having a greater cross-sectional area (i.e., x-y direction) and/or a greater thickness (i.e., z-height) as compared to a second trace). A greater cross-sectional area and/or a greater thickness may provide for reduced direct current resistance (DCR) and increased efficiency. The increased efficiency may have benefits, such as enabling a longer battery life or requiring less power. As used herein, a trace may refer to a conductive pathway that is to carry data signals to or from a component coupled with the trace. For example, a trace may carry data signals between various processors, or between a processor and a memory.

Forming traces having different thicknesses typically requires two lithography steps, which is likely to cause misalignment between lithography steps and may require larger traces to compensate for the misalignment and/or may require larger input/output (I/O) rules. Larger traces and constrained routing space may decrease IC device performance due to mismatched impedances for different traces. Further, forming traces having different thicknesses using two lithography steps usually results in non-rectilinear traces (e.g., traces having surfaces that are not straight or linear), or traces having a cross-section that is non-rectangular to offset the misalignment error between steps. For example, a trace may have a larger cross-section for a first conductive material deposition as compared to a second conductive material deposition, or a trace may have a curved surface resulting from a second conductive material deposition having a larger cross-section and/or rounded or domed top surface as compared with a first conductive material deposition, where the second conductive material deposition completely covers the first material deposition. Various ones of the microelectronic assemblies disclosed herein may exhibit increased efficiency, better power delivery, increased efficiency, and increased battery life relative to conventional approaches. The microelectronic assemblies disclosed herein may be particularly advantageous for high-performance computing, and multiple chip IC packages.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous, as are a "die" and an "IC die." The terms "top" and "bottom" may be used herein to explain various features of the drawings, but these terms are simply for ease of discussion, and do not imply a desired or required orientation. As used herein, the term "insulating" may mean "electrically insulating," unless otherwise specified.

When used to describe a range of dimensions, the phrase "between X and Y" represents a range that includes X and Y. For convenience, the phrase "FIG. 1" may be used to refer to the collection of drawings of FIGS. 1A-1B, the phrase "FIG. 2" may be used to refer to the collection of drawings of FIGS. 2A-2F, etc. Although certain elements may be referred to in the singular herein, such elements may include multiple sub-elements. For example, "an insulating material" may include one or more insulating materials.

As used herein, "conductive pathways" may include conductive traces, pads, vias, and through-holes, and other conductive structures that electrically couple an IC package component to another IC package component or to another component external to the IC package. As used herein, the terms "trace" and "line" may be used interchangeably and may refer to an interconnect in a conductive layer. As used herein, "conductive structures," "conductive features," and "conductive elements" may be used interchangeably and may refer to a trace, a line, a plane, a pad, a via, or another conductive component. The terms "trace," "routing trace," and "signal trace" may be used interchangeably herein.

FIG. 1A is a side, cross-sectional view of a microelectronic assembly 100A, in accordance with various embodiments. The microelectronic assembly 100A may include a package substrate 102 having a plurality of conductive layers that alternate with a plurality of dielectric layers. In particular, the package substrate 102 may include a dielectric layer having an electroless catalyst-doped PID material 103. The package substrate 102 may further include a conductive layer in the electroless catalyst-doped PID material 103 having a first conductive feature 118 with a first thickness (T1) and a second conductive feature 128 with a second thickness (T2), where the first thickness (T1) is different from the second thickness (T2). For example, as shown in FIG. 1A, the first thickness is greater than the second thickness. In some embodiments, the first thickness may be less than the second thickness. In particular, the first conductive feature 118 and the second conductive feature 128 may be in (e.g., surrounded by) the electroless catalyst-doped PID material 103. The electroless catalyst-doped PID material 103 may be selectively activated in laser-ablated areas and may be removed to form openings. The laser may reduce the catalyst to a catalytically active state to enable selective laser-patterning in the electroless catalyst-doped PID for electroless plating.

The electroless catalyst-doped PID material 103 may include any suitable electroless catalyst, including, for example, palladium, gold, silver, ruthenium, cobalt, copper, nickel, silicon carbide, silicon nitride, barium titanate, lead titanate, tantalum nitride, aluminum oxide, and aluminum nitride. In some embodiments, the electroless catalyst-doped PID material 103 may include more than one electroless catalyst. In some embodiments, an electroless catalyst-doped PID may include an electroless catalyst of up to 10 weight percent. In some embodiments, the amount of electroless may depend on a desired plating rate. For example, a PID including palladium as a dopant catalyst may include up to 1 weight percent of palladium and a PID including barium titanate as a dopant catalyst may include up to 10 weight percent of barium titanate. In some embodiments, an electroless catalyst-doped PID may include up to 5 weight percent of palladium. The electroless catalyst dopant may be detected using any suitable process, including x-ray photoelectron spectroscopy (XPS), energy-dispersive spectroscopy (EDS), or Fourier-transform infrared spectroscopy (FTIR), among others.

The electroless catalyst-doped PID material 103 may include any suitable photo-imageable dielectric. As used herein, the term "photo-imageable material" and "photodefinable material" may be used interchangeably. More generally, any of the microelectronic assemblies 100 disclosed herein may include a photo-imageable material in which a recess or an opening may be defined, or whose manufacture includes the formation of a recess or opening in a photo-imageable material (e.g., as discussed below with reference to FIG. 2), as disclosed herein. As used herein, a "photo-imageable material" refers to a material that includes photocatalytic components that cross-link or render the material soluble when exposed to appropriate illumination. Some photodefinable materials may have a negative tone (i.e., exposure to illumination causes the material to cure in a manner that resists etching during development), and other photodefinable materials may have a positive tone (i.e., exposure to illumination causes the material to cure in a manner that enhances etching during development). For example, in some embodiments, the electroless catalyst-doped PID material 103 may include a positive tone PID material (e.g., a diazobenzoquionone with an acetyl backbone polymer), and in other embodiments, the electroless catalyst-doped PID material 103 may include a negative-tone PID (e.g., an acrylate with an ester backbone polymer). Some photodefinable materials may be solder resist materials; such materials may come in contact with solder during a reflow process (e.g., when forming interconnects 138). In some embodiments, a photodefinable material that is a solder resist may include barium and sulfur (e.g., in the form of barium sulfate). In some embodiments, a photodefinable material that is a solder resist may include a silica filler in the amount of 70 percent to 90 percent by weight. Some photodefinable materials may be photo-imageable dielectric (PID) materials, such as epoxides that include photocatalytic components. In some embodiments, a photodefinable material that is a photo-imageable dielectric may include a silica filler in the amount of 20 percent to 30 percent by weight. Some photodefinable materials may be build-up materials, such as a build-up film. In some embodiments, a photodefinable material that is a build-up material may include a silica filler in the amount of 70 percent to 80 percent by weight. Other photodefinable materials may be used as appropriate.

The plurality of dielectric layers in the package substrate 102 may include any suitable dielectric material, for example, epoxy-based materials/films, ceramic/silica filled epoxide films, polyimide films, filled polyimide films, other organic materials, and other inorganic dielectric materials known from semiconductor processing, as well as silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass (OSG). An individual dielectric layer may include a single layer or may include multiple layers.

The plurality of dielectric layers of the package substrate 102, including the electroless catalyst-doped PID material 103, may be formed using any suitable process, including, for example, chemical vapor deposition (CVD), film lamination, slit coating and curing, atomic layer deposition (ALD), or spin-on process, among others, and with any suitable material. In some embodiments, a PID may be deposited by lamination and patterned by exposure to light.

The package substrate 102 may include one or more conductive pathways through the dielectric material (e.g., conductive pathways may include a conductive trace 117 and/or a conductive via 119, as shown in FIG. 1A). The conductive pathways may be formed using any suitable conductive material or materials, such as copper, silver, nickel, gold, aluminum, or other metals or alloys, for example. The conductive pathways may be formed using any suitable technique, such as electroplating. The conductive pathways in the package substrate 102 may be bordered by liner materials, such as adhesion liners and/or barrier liners, as suitable. An individual conductive layer may include a single layer or may include multiple layers; for example, a conductive layer may include a seed layer and a patterned trace layer. In some embodiments, a conductive layer may be a patterned trace layer. In some embodiments, a conductive layer may be a continuous layer. Although FIG. 1A illustrates a specific number and arrangement of conductive pathways in the package substrate 102, these are simply illustrative, and any suitable number and arrangement may be used.

The package substrate 102 may be any suitable substrate, and, in some embodiments, may not be a package substrate. In some embodiments, the substrate may be an organic or inorganic interposer, redistribution layer (RDL), or a standard build-up layer. The package substrate 102 may be a cored or coreless substrate of a semiconductor package. The package substrate 102 may be glass, an organic package substrate, an inorganic package substrate, or a combination of organic and inorganic materials.

Microelectronic assembly 100A may include a die 114. The die 114 may be coupled to the package substrate 102 by first-level interconnects (FLI) 138 at a top surface 170-2 of the package substrate 102. In particular, the package substrate 102 may include conductive contacts 140 at its top surface 170-2, the die 114 may include conductive contacts 136 at its bottom surface, and the FLI 138 may electrically and mechanically couple the conductive contacts 136 and the conductive contacts 140. The FLI 138 illustrated in FIG. 1A are solder balls or solder bumps (e.g., for a ball grid array arrangement), but any suitable FLI 138 may be used (e.g., pins in a pin grid array arrangement or lands in a land grid array arrangement).

The die 114 may include a semiconductor layer with active devices patterned on it (e.g., transistors, diodes, etc.), an insulating material (e.g., a dielectric material formed in multiple layers, or semiconductor material, as known in the art), and multiple conductive pathways formed through the insulating material. In some embodiments, the insulating material of a die 114 may include a dielectric material, such as silicon dioxide, silicon nitride, BT resin, polyimide materials, glass reinforced epoxy matrix materials, or low-k and ultra low-k dielectric (e.g., carbon doped dielectrics, fluorine-doped dielectrics, porous dielectrics, and organic polymeric dielectrics). For example, the die 114 may include a dielectric build-up film, such as Ajinomoto build-up film (ABF). In some embodiments, the insulating material of die 114 may be a semiconductor material, such as silicon, germanium, or a III-V material. In some embodiments, the die 114 may include silicon. The conductive pathways in die 114 may include conductive traces and/or conductive vias, and may connect any of the conductive contacts in the die 114 in any suitable manner (e.g., connecting multiple conductive contacts on a same surface of the die 114).

In some embodiments, the area between the die 114 and the package substrate 102 may be filled with underfill (not shown), which may be a mold compound or any other suitable material to fill the gap between the die 114 and the package substrate 102. Underfill may be applied using any suitable technique, such as transfer mold, capillary underfill, or epoxy flux as part of the thermocompression bonding (TCB) process. In some embodiments, the underfill may extend beyond the area defined by the die 114.

Although FIG. 1A depicts a single die 114, the microelectronic assembly 100A may have any suitable number of dies. In some embodiments, the die 114 may be an active or passive die that may include input/output circuitry, high bandwidth memory, or enhanced dynamic random access memory (EDRAM). For example, the die 114 may include a processor (e.g., including transistors, arithmetic logic units, and other components) that may include a central processing unit (CPU), a graphics processing unit (GPU), or both. The processor may also include application-specific integrated circuits (ASIC). In some embodiments, microelectronic assemblies disclosed herein may include a plurality of dies coupled to the package substrate 102 or coupled to another die in a package-on-package (PoP) configuration. In some embodiments, the microelectronic assembly 100A may serve as a system-in-package (SiP) in which multiple dies having different functionality are included. In such embodiments, the microelectronic assembly may be referred to as an SiP.

The microelectronic assembly 100A of FIG. 1A may also include a circuit board 134. The package substrate 102 may be coupled to the circuit board 134 by second-level interconnects (SLI) 137 at a bottom surface 170-1 of the package substrate 102. In particular, the package substrate 102 may include conductive contacts 139 at its bottom surface 170-1, and the circuit board 134 may include conductive contacts 135 at its top surface; the SLI 137 may electrically and mechanically couple the conductive contacts 135 and the conductive contacts 139. The SLI 137 illustrated in FIG. 1A are solder balls (e.g., for a ball grid array arrangement), but any suitable SLI 137 may be used (e.g., pins in a pin grid array arrangement or lands in a land grid array arrangement). The circuit board 134 may be a motherboard, for example, and may have other components attached to it (not shown). The circuit board 134 may include conductive pathways and other conductive contacts (not shown) for routing power, ground, and signals through the circuit board 134, as known in the art. In some embodiments, the SLI 137 may not couple the package substrate 102 to a circuit board 134, but may instead couple the package substrate 102 to another IC package, an interposer, or any other suitable component.

A number of elements are illustrated in FIG. 1A, but a number of these elements may not be present in microelectronic assemblies disclosed herein. For example, in various embodiments, the SLI 137, and/or the circuit board 134 may not be included. Further, FIG. 1A illustrates a number of elements that are omitted from subsequent drawings for ease of illustration, but may be included in any of the microelectronic assemblies disclosed herein. Examples of such elements include the die 114, the FLI 138, the SLI 137, and/or the circuit board 134. Many of the elements of the microelectronic assembly 100A of FIG. 1A are included in other ones of the accompanying figures; the discussion of these elements is not repeated when discussing these figures, and any of these elements may take any of the forms disclosed herein. A number of elements are not illustrated in FIG. 1A, but may be present in microelectronic subassemblies disclosed herein; for example, additional active components, such as additional dies, or additional passive components, such as surface-mount resistors, capacitors, and/or inductors, may be disposed on the top surface or the bottom surface of the package substrate 102, or embedded in the package substrate 102, and may be electrically connected by the conductive pathways in the package substrate 102.

Figure 1B:
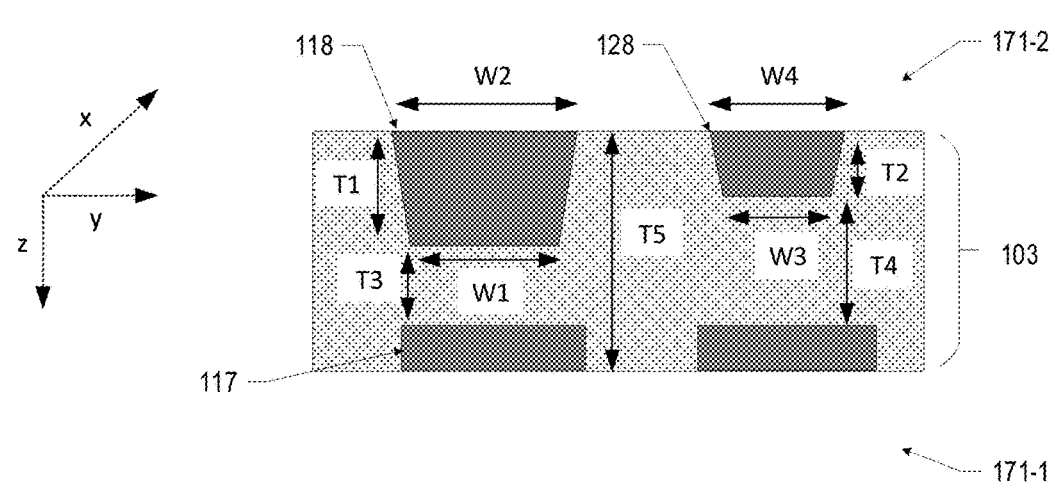
FIG. 1B is a side, cross-sectional, magnified view of a portion of the substrate of FIG. 1A, in accordance with various embodiments.

FIG. 1B is a cross-sectional, magnified view of a portion of the microelectronic assembly of FIG. 1A, as indicated by the dotted lines, in accordance with various embodiments. As shown in FIG. 1B, an x-dimension is length, a y-dimension is width, and a z-dimension is thickness. The microelectronic assembly 100B shows a package substrate 102 with a conductive layer having a first conductive feature 118 with a first thickness (T1) and a second conductive feature 128 with a second thickness (T2), where T1 is different from T2. For example, as shown in FIG. 1A, T1 may be greater than T2. In some embodiments, T1 may be twice T2. In some embodiments, T1 may be greater than twice T2. In some embodiments, T1 may be less than twice T2. The first and second conductive features 118, 128 may have any suitable dimensions. In some embodiments, T1 may be between 4 micron (um) and 143 um. In some embodiments, T1 may be between 4 um and 40 um. In some embodiments, T1 may be between 25 um and 100 um. In some embodiments, T1 may be between 80 um and 143 um. In some embodiments, T2 may be between 2 um and 141 um. In some embodiments, T2 may be between 2 um and 35 um. In some embodiments, T2 may be between 30 um and 95 um. In some embodiments, T2 may be between 75 um and 141 um.

In some embodiments, the first and second conductive features 118, 128 may have a non-rectangular cross-section, such that the first and second conductive features 118, 128 have a non-uniform width (e.g., y-dimension) along a thickness (e.g., z-dimension or z-height). For example, the side surfaces may taper or slant such that there is a differential between a top width and a bottom width of the conductive feature. For example, the first conductive feature 118 may have a first width W1 on a bottom surface 171-1 and a second width W2 on a top surface 171-2 and the second conductive feature 128 may have a first width W3 on the bottom surface 171-1 and a second width W4 on the top surface 171-2, where the first width (e.g., W1, W3) is less than the second width (e.g., W2, W4). In some embodiments, the first width (e.g., W1, W3) may be between 2 um and 500 um. In some embodiments, the second width (e.g., W2, W4) may be between 2 um and 500 um. In some embodiments, first and second conductive features 118, 128 may have a length (e.g., y-dimension, not shown) between 5 um and 5000 um.

As used herein, non-rectangular refers to a feature having surfaces that do not meet at right angles (e.g., not 90 degrees). For example, a feature may have linear top, bottom, and side surfaces, where the side surfaces (e.g., sides or sidewalls) meet the top and bottom surfaces at greater than 90 degrees or less than 90 degrees. As used herein, a feature having "a non-uniform width," "angled sidewalls," "sloped sidewalls," or "a non-rectilinear or non-rectangular cross-section" generally refers to a feature having sloped surfaces, where the side surfaces are non-perpendicular to a top surface and a bottom surface. In some embodiments, the first and second conductive features may be first and second traces, respectively. In some embodiments, a first trace may have a first thickness that is greater than a second thickness arranged to carry a first signal having a first frequency, and a second trace may have a second thickness that is less than the first thickness and may be arranged to carry a second signal having a second frequency, where the second frequency is different from the first frequency. In some embodiments, the first and second frequencies may be between 100 kilohertz (kHz) and 100 gigahertz (GHz). In some embodiments, the first and/or second conductive feature may be a contact pad or may be a plane.

The package substrate 102 may also include the electroless catalyst-doped PID material 103 where the PID material 103 may have different thicknesses relative to the different conductive feature thicknesses. For example, the PID material 103 may have a third thickness (T3) under the first conductive feature 118, a fourth thickness (T4) under the second conductive feature 128, and a fifth thickness (T5) which is measured from a bottom surface 171-1 of the PID material 103 to a top surface 171-2 of the PID material 103. In some embodiments, T4 may be greater than T3. In some embodiments, T5 may be between 7 um and 150 um. In some embodiments, T5 may be between 7 um and 50 um. In some embodiments, T5 may be between 50 um and 100 um. In some embodiments, T5 may be between 100 um and 150 um.

As used herein, the term "lower density" and "higher density" are relative terms indicating that the conductive pathways (e.g., including conductive lines and conductive vias) in a lower density medium are larger and/or have a greater pitch than the conductive pathways in a higher density medium. For example, a higher density medium (e.g., the die 114) may have a line or space pitch of approximately 10 microns, while a lower density medium (e.g., the package substrate 102) may have a line or space pitch of approximately 40-50 microns. In another example, a higher density medium may have a line or space pitch of less than 20 microns, while a lower density medium may have a line or space pitch greater than 40 microns. A higher density medium may be manufactured using a modified semi-additive process or a semi-additive build-up process with advanced lithography (with small vertical interconnect features formed by advanced laser or lithography processes), while a lower density medium may be a printed circuit board (PCB) (e.g., circuit board 134) manufactured using a standard PCB process (e.g., a standard subtractive process using etch chemistry to remove areas of unwanted copper, and with coarse vertical interconnect features formed by a standard laser process).

Although FIG. 1B shows only two conductive features 118, 128 having particular thicknesses (e.g., T1, T2), a microelectronic assembly may include any number of conductive features, including more than two conductive features, and the more than two conductive features may have any suitable thicknesses including a thickness equal to T1 or T2, or a thickness that is different from T1 or T2. Likewise, a microelectronic assembly may include any number of electroless catalyst-doped PID layers having any suitable thickness, and the thickness of the electroless catalyst-doped PID layers may depend on the relative thicknesses of the two or more conductive features.

Any suitable techniques may be used to manufacture the microelectronic assemblies disclosed herein. For example, FIGS. 2A-2F are side, cross-sectional views of various stages in an example process for manufacturing a microelectronic assembly, in accordance with various embodiments. Although the operations discussed below with FIGS. 2A-2F (and others of the accompanying drawings representing manufacturing processes) are illustrated in a particular order, these operations may be performed in any suitable order. Additionally, although particular assemblies are illustrated in FIGS. 2A-2F (and others of the accompanying drawings representing manufacturing processes), the operations discussed below with reference to FIGS. 2A-2F may be used to form any suitable assemblies.

Figure 2A:
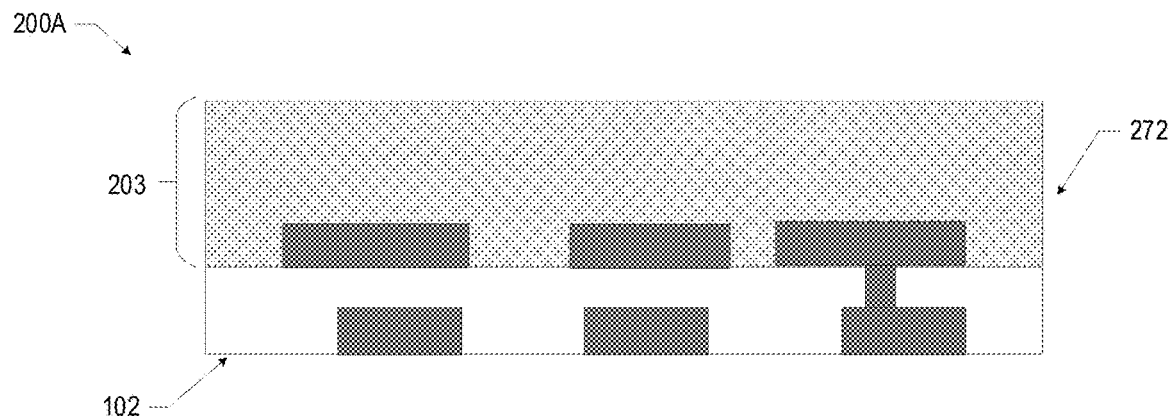
FIGS. 2A-2F are side, cross-sectional views of various stages in an example process for manufacturing a microelectronic assembly, in accordance with various embodiments.

FIG. 2A illustrates an assembly 200A including a portion of a package substrate 102 subsequent to depositing an electroless catalyst-doped PID material 203 on a top surface 272 of the portion of the package substrate 102. The electroless catalyst-doped PID material 203 may include any suitable photo-imageable dielectric material and any suitable electroless catalyst, as described above with reference to FIG. 1. The electroless catalyst-doped PID material 203 may be formed using any suitable technique, for example, lamination.

Figure 2B:
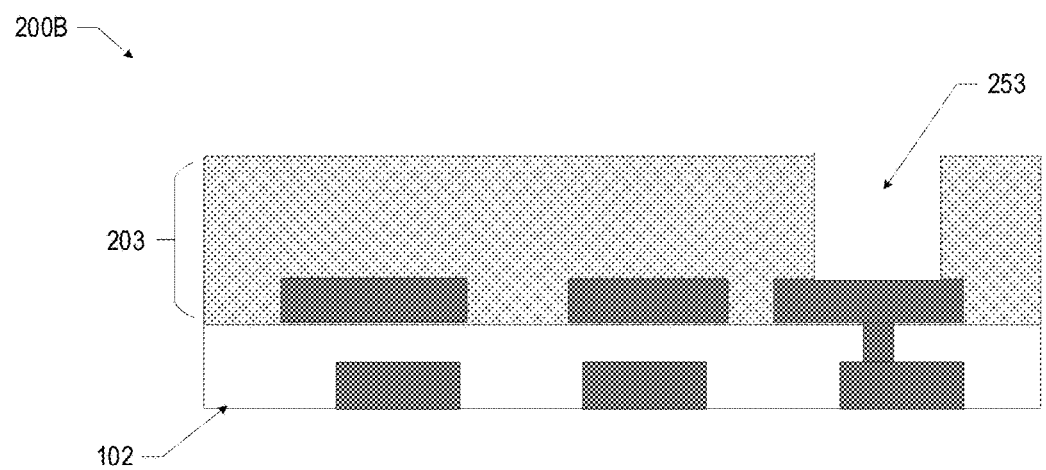

FIG. 2B illustrates an assembly 200B subsequent to patterning the electroless catalyst-doped PID material 203 to provide a first opening 253 for the formation of a larger conductive feature (e.g., conductive features having a thickness greater than 150 um and/or a width greater than 500 um, such as a conductive via, a conductive pad, or a conductive plane). The electroless catalyst-doped PID material 203 may be patterned using any suitable technique, including a lithographic process (e.g., exposing the electroless catalyst-doped PID material 203 to a radiation source, for example, light). The first opening 253 may have any suitable size and shape for forming a conductive feature having desired characteristics. For example, the first opening 253 may be shaped to form a conductive via having a particular size and shape, such as a rectangular cross-section.

Figure 2C:
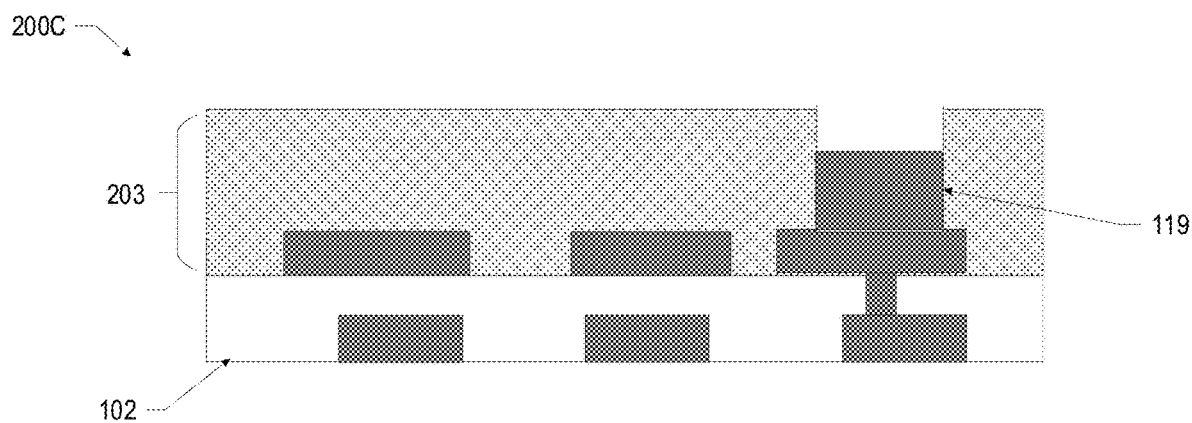

FIG. 2C illustrates an assembly 200C subsequent to depositing a first conductive material in the first opening 253 for the formation, or a partial formation, of a conductive via 119. In some embodiments, as shown in FIG. 2C, the first conductive material may be deposited to partially fill the first opening 253. In some embodiments, the first conductive material may be deposited to fill the first opening 253. The first conductive material may be deposited using any suitable technique, including, for example, electroplating, sputtering, or electroless plating. The conductive via 119 may be formed from any suitable conductive material, for example, copper (Cu), aluminum (Al), gold (Au), silver (Ag), and/or alloys thereof. In some embodiments, a seed layer (not shown) may be deposited prior to depositing the first conductive material. In some embodiments, the seed layer may be omitted.

Figure 2D:
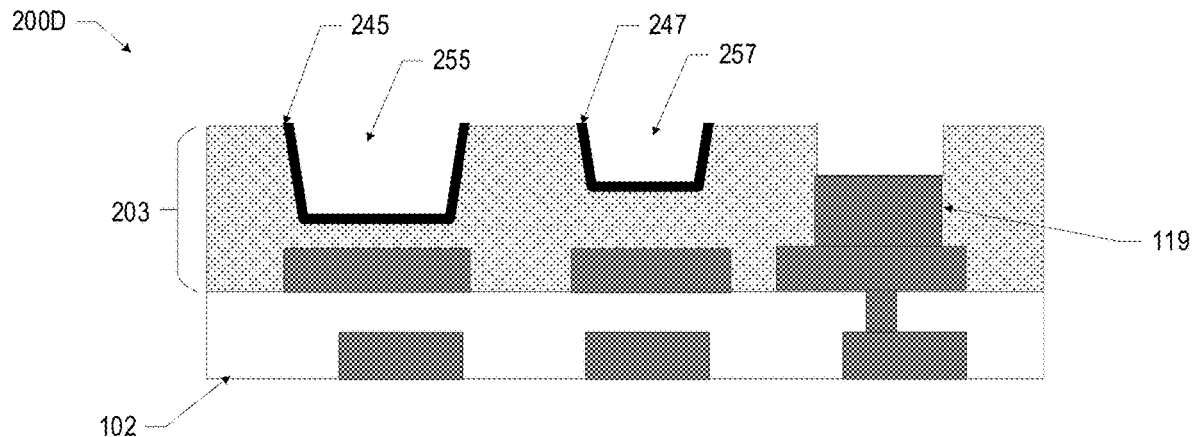

FIG. 2D illustrates an assembly 200D subsequent to laser drilling the electroless catalyst-doped PID material 203 to form a second opening 255 and a third opening 257. The second and third openings 255, 257 may be formed using any suitable technique, including, for example, laser drilling, to selectively activate the electroless catalyst-doped PID material 203 and form openings having different thicknesses (e.g., T1 and T2 as shown in FIG. 1). Any residue remaining in the second and third openings 255, 257 may be cleaned away using any suitable process, such as a wet desmear process. In some embodiments, after laser ablation, a portion (e.g., surfaces 245, 247 of the second and third openings) of the electroless catalyst-doped PID material 203 may be catalytically activated and chemically different from portions of the electroless catalyst-doped PID material 203 that were not exposed to laser ablation.

Figure 2E:
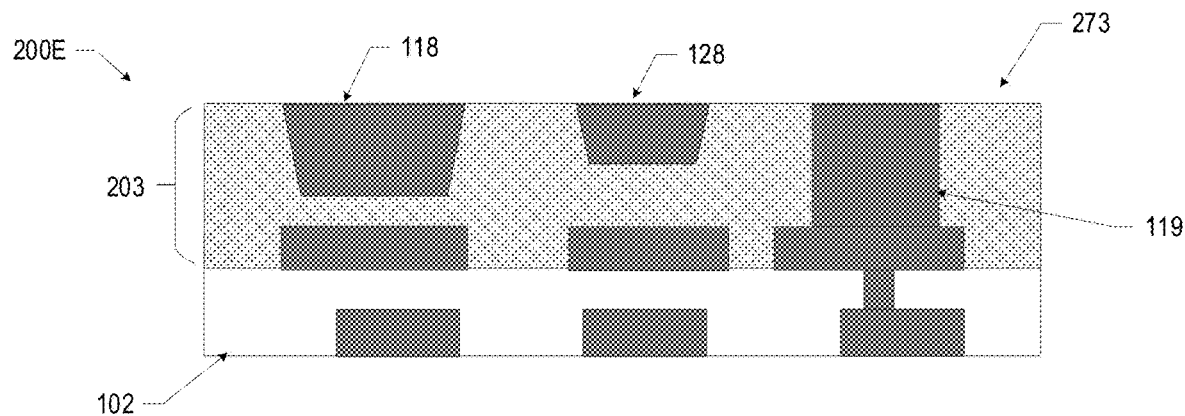

FIG. 2E illustrates an assembly 200E subsequent to depositing a second conductive material in the first opening 253, if necessary, to form conductive feature 119, and in the second and third openings 255, 257 to form conductive features 118, 128. The second conductive material may be deposited in the first opening 253 using any suitable technique, including, for example, electroplating, sputtering, or electroless plating. The second conductive material may be deposited in the second and third openings 255, 257 using any suitable technique, for example, electroless plating. The second conductive material may be any suitable conductive material, including, copper, and may be a same conductive material as the first conductive material, or may be a different conductive material. In some embodiments, exposed top surfaces 273 of the conductive features 118 and/or 128 may be planarized or polished to remove excess conductive material. In some embodiments, the top surfaces 273 of the conductive material may be recessed to a desired thickness (e.g., T1, T2, T5) with a flash etching process, a wet etch or a dry etch process. In some embodiments, the conductive material may be removed using a chemical mechanical planarization (CMP) process.

Figure 2F:
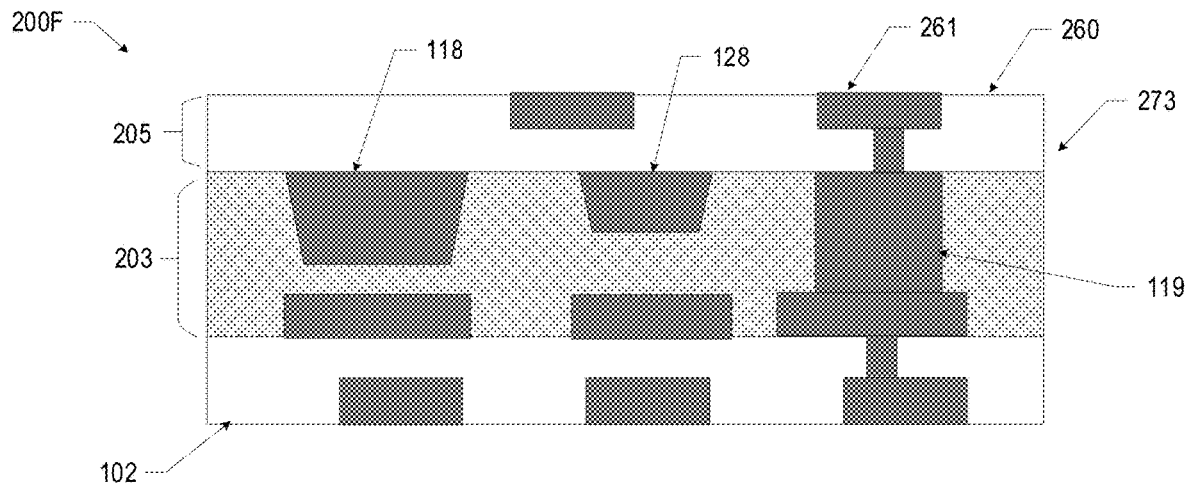

FIG. 2F illustrates an assembly 200F subsequent to forming additional build-up layers 205 in the package substrate 102 (e.g., a dielectric layer 260 having conductive pathways 261 over the top surfaces 273 of the conductive features 118, 128, 119). Additional layers may be built up in the package substrate 102 by any suitable process, which is known in the art, including a semi-additive process (SAP). For example, additional layers may be built up by depositing a dielectric material, forming openings in the dielectric material, and depositing conductive material in the openings to form conductive pathways. The openings may be formed using any suitable technique, including, for example, laser drilling. Any residue remaining in the opening may be cleaned away using any suitable process, such as a wet desmear process. The conductive material may be deposited using any suitable technique, including, for example, electroplating, sputtering, or electroless plating. The conductive material may be any suitable conductive material, including, copper, and may be a same conductive material as the conductive features 118, 128, or may be a different conductive material from the conductive features 118, 128. The finished substrate may be a single package substrate or may be a repeating unit that may undergo a singulation process in which each unit is separated from one another to create a single package substrate. Further operations may be performed as suitable (e.g., attaching dies to the package substrate, attaching solder balls for coupling to a circuit board, etc.).

Although FIG. 2 shows a particular number and arrangement of conductive features 118, 128, 119 in a single electroless catalyst-doped PID material 203, these are simply exemplary and a package substrate may have any suitable number of electroless catalyst-doped PID layers having any suitable number and arrangement of conductive features with different thicknesses. Additional electroless catalyst-doped PID layers having conductive features with different thicknesses may be formed by repeating the process as described with respect to FIGS. 2A-2E.

Figure 3:
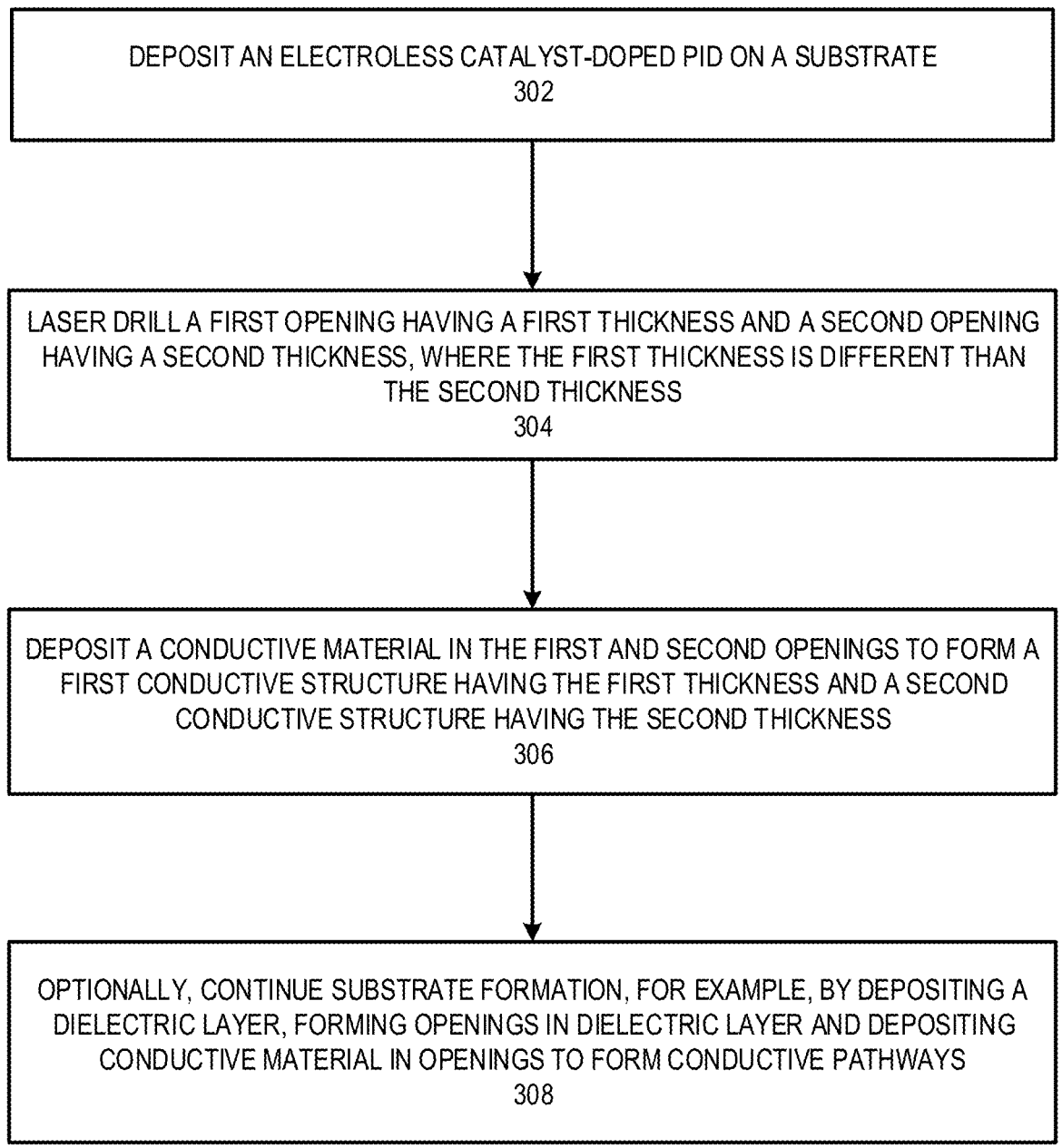
FIG. 3 is a process flow diagram of an example method of forming a microelectronic assembly, in accordance with various embodiments.

FIG. 3 is a process flow diagram of an example method of forming a microelectronic assembly including an electroless catalyst-doped PID material with a plurality of conductive structures having different thicknesses, in accordance with various embodiments. At 302, deposit an electroless catalyst-doped PID on a substrate. At 304, laser drill a first opening having a first thickness and a second opening having a second thickness in the electroless catalyst-doped PID, where the first thickness is different than the second thickness. At 306, deposit a conductive material in the first and second openings to form a first conductive structure having the first thickness and a second conductive structure having the second thickness. The conductive material, such as copper, may be deposited by, for example, electroless plating. At 308, optionally, continue building up the substrate by adding additional conductive and dielectric layers using any suitable process. Additional electroless catalyst-doped PID layers including conductive structures having different thicknesses may be formed by repeating the process as described in 302 through 306. The finished substrate may be a single package substrate or may be a repeating unit that may undergo a singulation process in which each unit is separated from one another to create a single package substrate.

Figure 4:
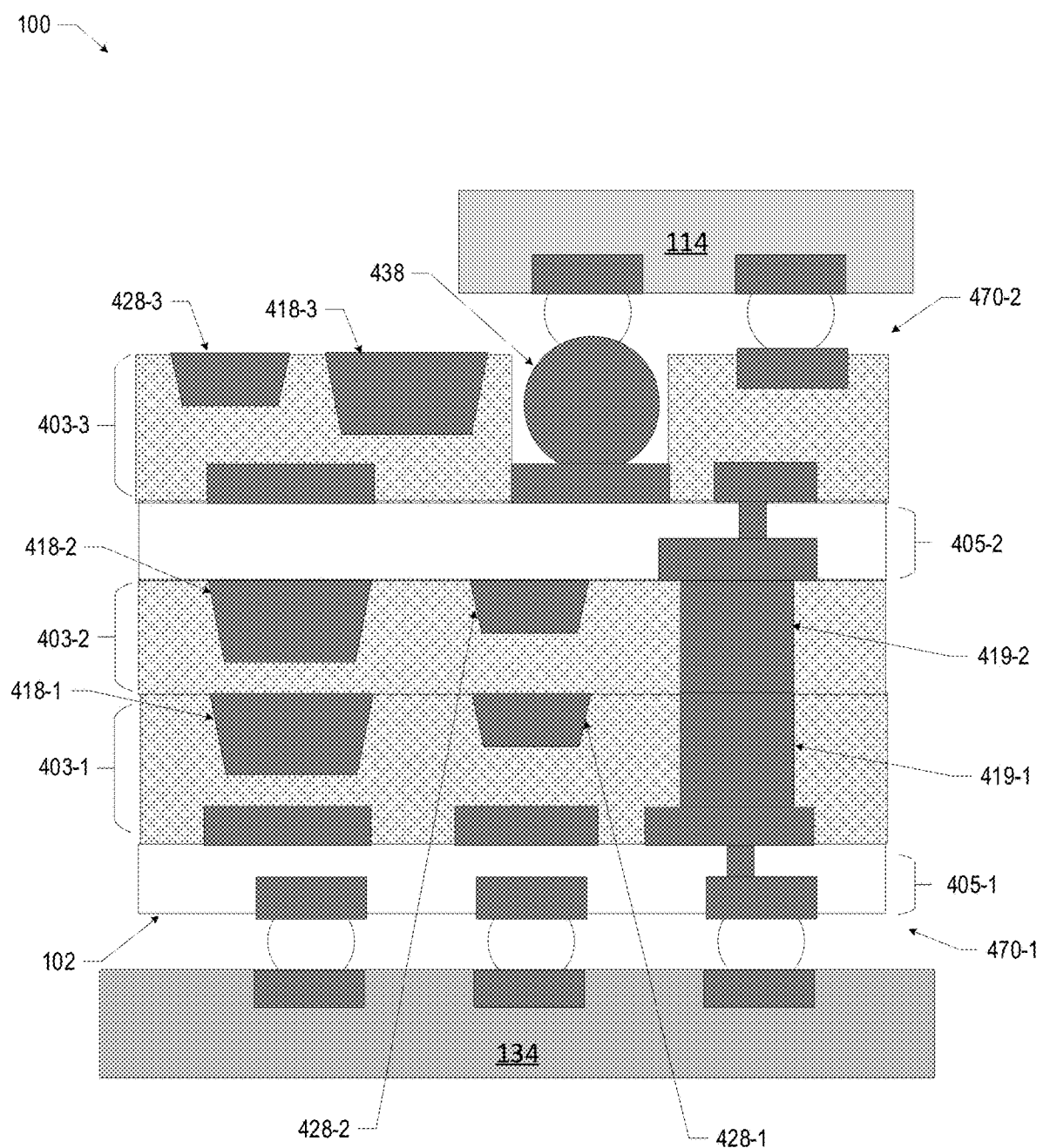
FIG. 4 is a side, cross-sectional view of an example microelectronic assembly, in accordance with various embodiments.

FIG. 4 is a side, cross-sectional view of a microelectronic assembly 100, in accordance with various embodiments. The microelectronic assembly 100 may include a package substrate 102 coupled to a circuit board 134 on a first surface 470-1 and coupled to a die 114 on a second surface 470-2. The package substrate 102 may include a plurality of dielectric layers having an electroless catalyst-doped PID material 403 and a plurality of dielectric layers 405 that do not have the electroless catalyst-doped PID material. The dielectric layers 403, 405 may include conductive pathways for routing signals and power through the package substrate. The electroless catalyst-doped PID material 403 may be formed as described above with reference to FIG. 2. As shown in FIG. 4, the package substrate 102 may include three electroless catalyst-doped PID material layers 403-1, 403-2, 403-3 and two dielectric layers 405-1, 405-2. The three electroless catalyst-doped PID material layers 403-1, 403-2, 403-3 may include a plurality of conductive structures 418, 428, 419 having different thicknesses. In particular, the first electroless catalyst-doped PID material layer 403-1 may include three conductive structures 418-1, 428-1, 419-1 having three different thicknesses, the second electroless catalyst-doped PID material layer 403-2 may include three conductive structures 418-2, 428-2, 419-2 having three different thicknesses, and the third electroless catalyst-doped PID material layer 403-2 may include two conductive structures 418-3, 428-3 having different thicknesses. The third electroless catalyst-doped PID material layer 403-3 may further include a solder ball 438 for coupling to the die 114. The opening for the solder ball 438 may be formed using any suitable technique, including a lithographical process.

The microelectronic assemblies disclosed herein may be used for any suitable application. For example, in some embodiments, a microelectronic assembly may include a die that may be used to provide an ultra-high density and high bandwidth interconnect for field programmable gate array (FPGA) transceivers and III-V amplifiers. In an example, a microelectronic assembly may include a die that may be a processing device (e.g., a CPU, a radio frequency chip, a power converter, a network processor, a GPU, a FPGA, a modem, an applications processor, etc.), and the die may include high bandwidth memory, transceiver circuitry, and/or input/output circuitry (e.g., Double Data Rate transfer circuitry, Peripheral Component Interconnect Express circuitry, etc.).

In another example, a microelectronic assembly may include a die that may be a cache memory (e.g., a third-level cache memory), and one or more dies that may be processing devices (e.g., a CPU, a radio frequency chip, a power converter, a network processor, a GPU, a FPGA, a modem, an applications processor, etc.) that share the cache memory of the die.

Figure 5:
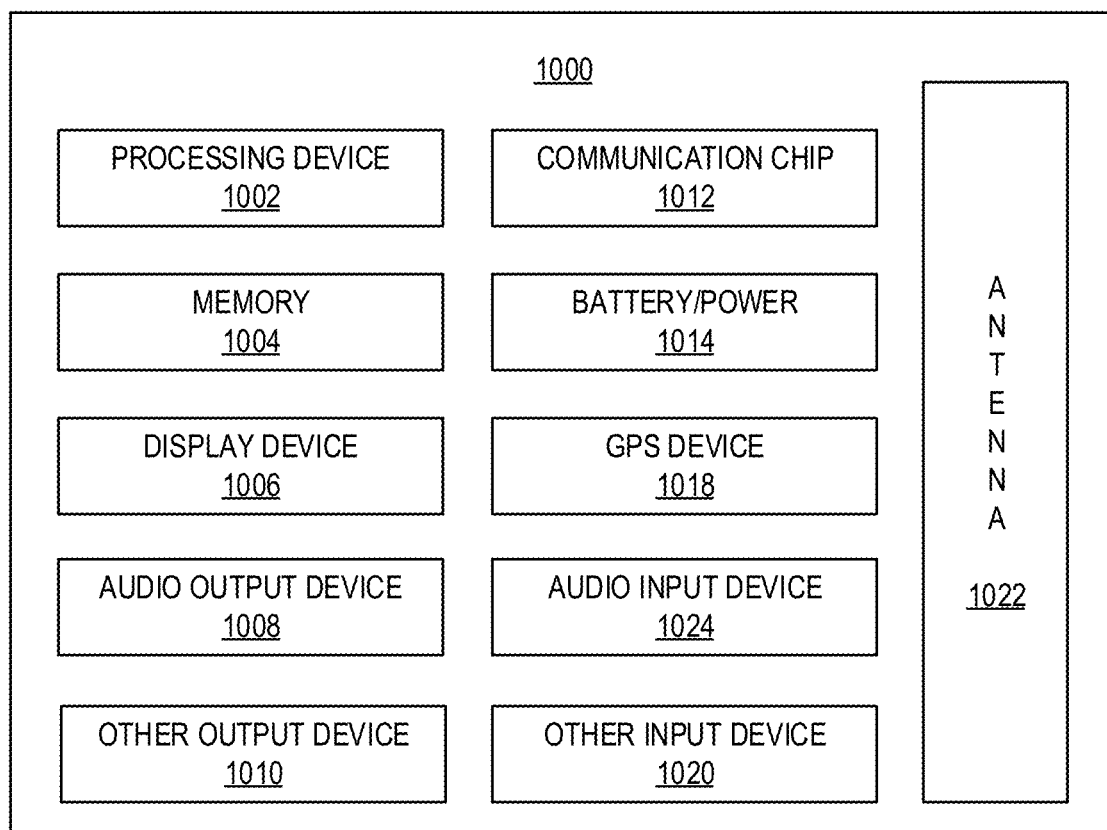
FIG. 5 is a block diagram of an example electrical device that may include a microelectronic assembly, in accordance with any of the embodiments disclosed herein.

The microelectronic assemblies disclosed herein may be included in any suitable electronic component. FIG. 5 is a block diagram of an example electrical device 1000 that may include one or more of the microelectronic assemblies disclosed herein. For example, any suitable ones of the components of the electrical device 1000 may be arranged in any of the microelectronic assemblies disclosed herein. A number of components are illustrated in FIG. 5 as included in the electrical device 1000, but any one or more of these components may be omitted or duplicated, as suitable for the application. In some embodiments, some or all of the components included in the electrical device 1000 may be attached to one or more motherboards. In some embodiments, some or all of these components are fabricated onto a single system-on-a-chip (SoC) die.

Additionally, in various embodiments, the electrical device 1000 may not include one or more of the components illustrated in FIG. 5, but the electrical device 1000 may include interface circuitry for coupling to the one or more components. For example, the electrical device 1000 may not include a display device 1006, but may include display device interface circuitry (e.g., a connector and driver circuitry) to which a display device 1006 may be coupled. In another set of examples, the electrical device 1000 may not include an audio input device 1024 or an audio output device 1008, but may include audio input or output device interface circuitry (e.g., connectors and supporting circuitry) to which an audio input device 1024 or audio output device 1008 may be coupled.

The electrical device 1000 may include a processing device 1002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1002 may include one or more digital signal processors (DSPs), ASICs, CPUs, GPUs, cryptoprocessors (specialized processors that execute cryptographic algorithms within hardware), server processors, or any other suitable processing devices. The electrical device 1000 may include a memory 1004, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1004 may include memory that shares a die with the processing device 1002. This memory may be used as cache memory and may include embedded dynamic random access memory (eDRAM) or spin transfer torque magnetic random access memory (STT-M RAM).

In some embodiments, the electrical device 1000 may include a communication chip 1012 (e.g., one or more communication chips). For example, the communication chip 1012 may be configured for managing wireless communications for the transfer of data to and from the electrical device 1000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1012 may implement any of a number of wireless standards or protocols, including but not limited to Institute of Electrical and Electronic Engineers (IEEE) standards including Wi-Fi (IEEE 802.11 family), IEEE 802.16 standards (e.g., IEEE 802.16-2005 Amendment), 3rd Generation Partnership Project (3GPP) Long-Term Evolution (LTE), 5G, 5G New Radio, along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1012 may operate in accordance with other wireless protocols in other embodiments. The electrical device 1000 may include an antenna 1022 to facilitate wireless communications and/or to receive other wireless communications (such as AM or FM radio transmissions).

In some embodiments, the communication chip 1012 may manage wired communications, such as electrical, optical, or any other suitable communication protocols (e.g., the Ethernet). As noted above, the communication chip 1012 may include multiple communication chips. For instance, a first communication chip 1012 may be dedicated to shorter-range wireless communications such as Wi-Fi or Bluetooth, and a second communication chip 1012 may be dedicated to longer-range wireless communications such as global positioning system (GPS), EDGE, GPRS, CDMA, WiMAX, LTE, EV-DO, or others. In some embodiments, a first communication chip 1012 may be dedicated to wireless communications, and a second communication chip 1012 may be dedicated to wired communications.

The electrical device 1000 may include battery/power circuitry 1014. The battery/power circuitry 1014 may include one or more energy storage devices (e.g., batteries or capacitors) and/or circuitry for coupling components of the electrical device 1000 to an energy source separate from the electrical device 1000 (e.g., AC line power).

The electrical device 1000 may include a display device 1006 (or corresponding interface circuitry, as discussed above). The display device 1006 may include any visual indicators, such as a heads-up display, a computer monitor, a projector, a touchscreen display, a liquid crystal display (LCD), a light-emitting diode display, or a flat panel display.

The electrical device 1000 may include an audio output device 1008 (or corresponding interface circuitry, as discussed above). The audio output device 1008 may include any device that generates an audible indicator, such as speakers, headsets, or earbuds.

The electrical device 1000 may include an audio input device 1024 (or corresponding interface circuitry, as discussed above). The audio input device 1024 may include any device that generates a signal representative of a sound, such as microphones, microphone arrays, or digital instruments (e.g., instruments having a musical instrument digital interface (MIDI) output).

The electrical device 1000 may include a GPS device 1018 (or corresponding interface circuitry, as discussed above). The GPS device 1018 may be in communication with a satellite-based system and may receive a location of the electrical device 1000, as known in the art.

The electrical device 1000 may include another output device 1010 (or corresponding interface circuitry, as discussed above). Examples of the other output device 1010 may include an audio codec, a video codec, a printer, a wired or wireless transmitter for providing information to other devices, or an additional storage device.

The electrical device 1000 may include another input device 1020 (or corresponding interface circuitry, as discussed above). Examples of the other input device 1020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1000 may have any desired form factor, such as a portable, hand-held, or mobile electrical device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some embodiments, the electrical device 1000 may be any other electronic device that processes data.

The following paragraphs provide various examples of the embodiments disclosed herein.

Example 1 is a microelectronic assembly, including a substrate layer having a surface, wherein the substrate layer includes a photo-imageable dielectric (PID) and an electroless catalyst, wherein the electroless catalyst includes one or more of palladium, gold, silver, ruthenium, cobalt, copper, nickel, titanium, aluminum, lead, silicon, and tantalum; a first conductive trace having a first thickness on the surface of the substrate layer; and a second conductive trace having a second thickness on the surface of the substrate layer, wherein the first thickness is greater than the second thickness.

Example 2 may include the subject matter of Example 1, and may further specify that the electroless catalyst in the PID has a weight percent of up to 10.

Example 3 may include the subject matter of Example 1, and may further specify that the electroless catalyst in the PID is palladium having a weight percent of up to 5.

Example 4 may include the subject matter of Example 1, and may further specify that the first thickness is between 4 um and 143 um.

Example 5 may include the subject matter of Example 1, and may further specify that the second thickness is between 2 um and 141 um.

Example 6 may include the subject matter of Example 1, and may further specify that the first and second conductive traces have sloped sidewalls.

Example 7 may include the subject matter of Example 1, and may further specify that the substrate layer is in an interposer.

Example 8 is a microelectronic assembly, including a first conductive feature having a first thickness in a layer of a package substrate, wherein the layer of the package substrate includes a photo-imageable dielectric (PID); and a second conductive feature having a second thickness in the layer of the package substrate, wherein the second thickness is different from the first thickness, and wherein the first and second conductive features have sloped sidewalls.

Example 9 may include the subject matter of Example 8, and may further specify that the PID includes one or more of palladium, gold, silver, ruthenium, cobalt, copper, nickel, titanium, aluminum, lead, silicon, or tantalum.

Example 10 may include the subject matter of Example 8, and may further specify that the first and second conductive features are traces.

Example 11 may include the subject matter of Example 8, and may further specify that the first and second conductive features are contact pads.

Example 12 may include the subject matter of Example 8, and may further specify that the first and second conductive features are planes.

Example 13 may include the subject matter of Example 8, and may further specify that the first thickness is between 4 um and 143 um.

Example 14 may include the subject matter of Example 8, and may further specify that the second thickness is between 2 um and 141 um.

Example 15 may include the subject matter of Example 8, and may further include a die electrically coupled to the package substrate.

Example 16 may include the subject matter of Example 15, and may further specify that the die is a central processing unit, a radio frequency chip, a power converter, or a network processor.

Example 17 may include the subject matter of Example 15, and may further specify that the first conductive feature or the second conductive feature is electrically coupled to the die via conductive pathways in the package substrate.

Example 18 is a computing device, including a package substrate having a first surface and an opposing second surface, the package substrate including a layer including a photo-imageable dielectric (PID); a first conductive trace having a first thickness in the layer of the package substrate; and a second conductive trace having a second thickness in the layer of the package substrate, wherein the second thickness is different from the first thickness, and wherein the first and second conductive traces have sloped sidewalls; a circuit board coupled to the first surface of the package substrate; and a die coupled to the second surface of the package substrate.

Example 19 may include the subject matter of Example 18, and may further specify that the first thickness is between 4 um and 143 um.

Example 20 may include the subject matter of Example 18, and may further specify that the second thickness is between 2 um and 141 um.

Example 21 may include the subject matter of Example 18, and may further specify that the PID includes one or more of palladium, gold, silver, ruthenium, cobalt, copper, nickel, titanium, aluminum, lead, silicon, or tantalum.

Example 22 may include the subject matter of any of Examples 18-21, and may further specify that the computing device is a server device.

Example 23 may include the subject matter of any of Examples 18-21, and may further specify that the computing device is a portable computing device.

Example 24 may include the subject matter of any of Examples 18-21, and may further specify that the computing device is a wearable computing device.

Example 25 is a method of manufacturing a microelectronic assembly, including depositing an electroless catalyst-doped photo-imageable dielectric (PID) on a substrate; laser drilling the electroless catalyst-doped PID to form a first opening having a first thickness and a second opening having a second thickness, wherein the first thickness is greater than the second thickness; and depositing a conductive material in the first opening to form a first conductive trace having the first thickness and in the second opening to form a second conductive trace having the second thickness.

Example 26 may include the subject matter of Example 25, and may further specify that the first thickness is between 4 um and 143 um.

Example 27 may include the subject matter of Example 25, and may further specify that the second thickness is between 2 um and 141 um.

Example 28 may include the subject matter of Example 25, and may further specify that a thickness of the electroless catalyst-doped PID is between 7 um and 150 um.

Example 29 may include the subject matter of Example 25, and may further specify that the conductive material is deposited using an electroless plating process.

Example 30 may include the subject matter of Example 25, and may further include removing a portion of the conductive material.

Example 31 may include the subject matter of Example 30, and may further specify that the portion of the conductive material is removed using a chemical mechanical planarization process.

Example 32 may include the subject matter of Example 25, and may further include forming a dielectric layer on the electroless catalyst-doped PID including the first and second conductive traces.

Example 33 may include the subject matter of Example 25, and may further specify that the conductive material is a second conductive material, and may further include lithographically developing, prior to laser drilling, the electroless catalyst-doped PID to form a third opening; and depositing a first conductive material in the third opening to form a conductive feature.

Example 34 may include the subject matter of Example 33, and may further specify that the first conductive material is deposited using an electrolytic process.

Example 35 may include the subject matter of Example 25, and may further specify that the electroless catalyst in the PID has a weight percent of up to 10.

Example 36 may include the subject matter of Example 25, and may further specify that the electroless catalyst-doped PID includes diazobenzoquionone or acrylate.

The invention claimed is:
1. A microelectronic assembly, comprising:
   a substrate layer having a surface, wherein the substrate layer includes a photo-imageable dielectric (PID) doped by an electroless catalyst, wherein the electroless catalyst includes one or more of palladium, gold, silver, ruthenium, cobalt, copper, nickel, titanium, aluminum, lead, silicon, and tantalum;
   a first conductive trace having a first thickness in the PID, wherein the first thickness is between 4 um and 143 um; and a second conductive trace having a second thickness in the PID, wherein the second thickness is between 2 um and 141 um, wherein the first thickness is greater than the second thickness, and wherein the first and second conductive traces have sloped sidewalls.

2. The microelectronic assembly of claim 1, wherein the electroless catalyst in the PID has a weight percent of up to 10.

3. The microelectronic assembly of claim 1, wherein the electroless catalyst in the PID is palladium having a weight percent of up to 5.

4. The microelectronic assembly of claim 1, wherein the substrate layer is in an interposer.

5. A microelectronic assembly, comprising:
- a first conductive feature having a first thickness in an electroless catalyst-doped photo-imageable dielectric (PID) layer of a substrate, wherein the first thickness is between 4 um and 143 um; and
- a second conductive feature having a second thickness in the PID layer of the substrate, wherein the second thickness is between 2 um and 141 um, wherein the second thickness is different from the first thickness, and wherein the first and second conductive features have sloped sidewalls.

6. The microelectronic assembly of claim 5, wherein the PID includes one or more of palladium, gold, silver, ruthenium, cobalt, copper, nickel, titanium, aluminum, lead, silicon, or tantalum.

7. The microelectronic assembly of claim 5, wherein the first and second conductive features are traces.

8. The microelectronic assembly of claim 5, further comprising:
- a die electrically coupled to the substrate.

9. The microelectronic assembly of claim 8, wherein the die is a central processing unit, a radio frequency chip, a power converter, or a network processor.

10. A computing device, comprising:
- a package substrate having a first surface and an opposing second surface, the package substrate comprising:
  - a layer including an electroless catalyst-doped photo-imageable dielectric (PID);
  - a first conductive trace having a first thickness in the PID wherein the first thickness is between 4 um and 143 um; and
  - a second conductive trace having a second thickness in the PID wherein the second thickness is between 2 um and 141 um, wherein the second thickness is different from the first thickness, and wherein the first and second conductive traces have sloped sidewalls;
- a circuit board coupled to the first surface of the package substrate; and
- a die coupled to the second surface of the package substrate.

11. The computing device of claim 10, wherein the PID includes one or more of palladium, gold, silver, ruthenium, cobalt, copper, nickel, titanium, aluminum, lead, silicon, or tantalum.

12. The computing device of claim 10, wherein the computing device is a server device.

13. The computing device of claim 10, wherein the computing device is a portable computing device.

* * * * *